US009136086B2

(12) United States Patent
Madocks

(10) Patent No.: US 9,136,086 B2
(45) Date of Patent: Sep. 15, 2015

(54) CLOSED DRIFT MAGNETIC FIELD ION SOURCE APPARATUS CONTAINING SELF-CLEANING ANODE AND A PROCESS FOR SUBSTRATE MODIFICATION THEREWITH

(75) Inventor: John E. Madocks, Tucson, AZ (US)

(73) Assignee: GENERAL PLASMA, INC., Tucson, AZ (US)

( * ) Notice: Subject to any disclaimer, the term of this patent is extended or adjusted under 35 U.S.C. 154(b) by 40 days.

(21) Appl. No.: 13/132,762

(22) PCT Filed: Dec. 8, 2009

(86) PCT No.: PCT/US2009/067149
§ 371 (c)(1),
(2), (4) Date: Jun. 3, 2011

(87) PCT Pub. No.: WO2010/077659
PCT Pub. Date: Jul. 8, 2010

(65) Prior Publication Data
US 2011/0226611 A1    Sep. 22, 2011

Related U.S. Application Data

(60) Provisional application No. 61/120,800, filed on Dec. 8, 2008.

(51) Int. Cl.
*C23C 14/00* (2006.01)
*H01J 37/08* (2006.01)
(Continued)

(52) U.S. Cl.
CPC ............. *H01J 37/08* (2013.01); *H01J 27/143* (2013.01); *H01J 37/3053* (2013.01); *H01J 37/317* (2013.01); *H01J 37/32862* (2013.01); *H01J 37/3405* (2013.01); *H01J 2237/081* (2013.01)

(58) Field of Classification Search
CPC  C23C 14/221; C23C 14/3442; H01J 37/3402
USPC .............. 250/423 R; 204/192.12; 118/723 R, 118/723 FI; 315/111.21
See application file for complete search history.

(56) References Cited

U.S. PATENT DOCUMENTS 3,735,591 A    5/1973  Burkhart
4,862,032 A    8/1989  Kaufman et al.
(Continued)

FOREIGN PATENT DOCUMENTS

DE    19928053 C5    6/1999

OTHER PUBLICATIONS

Pulsed DC and AC Reactive Sputtering of Dielectrics. "Part 1: Dual and Multiple Unbalanced Magnetic Arrangements", Vacuum Technology & Coating, by A. Belkind and S. Gershman, A. Belkind & Associates, LLC, Oct. 2013; www.vactechmag.com or www.vtcmag.com.
(Continued)

*Primary Examiner* — Keith Hendricks
*Assistant Examiner* — Timon Wanga
(74) *Attorney, Agent, or Firm* — Perkins Coie LLP

(57) ABSTRACT

A process for modifying a surface of a substrate is provided that includes supplying electrons to an electrically isolated anode electrode of a closed drift ion source. The anode electrode has an anode electrode charge bias that is positive while other components of the closed drift ion source are electrically grounded or support an electrical float voltage. The electrons encounter a closed drift magnetic field that induces ion formation. Anode contamination is prevented by switching the electrode charge bias to negative in the presence of a gas, a plasma is generated proximal to the anode electrode to clean deposited contaminants from the anode electrode. The electrode charge bias is then returned to positive in the presence of a repeat electron source to induce repeat ion formation to again modify the surface of the substrate. An apparatus for modification of a surface of a substrate by this process is provided.

15 Claims, 3 Drawing Sheets

(51) Int. Cl.
*H01J 27/14* (2006.01)
*H01J 37/305* (2006.01)
*H01J 37/317* (2006.01)
*H01J 37/32* (2006.01)
*H01J 37/34* (2006.01)

(56) References Cited

U.S. PATENT DOCUMENTS

| | | |
|---|---|---|
| 5,133,850 A | 7/1992 | Kukla et al. |
| 5,508,368 A | 4/1996 | Knapp et al. |
| 5,646,476 A | 7/1997 | Aston |
| 5,763,989 A | 6/1998 | Kaufman |
| 5,803,973 A | 9/1998 | Szczyrbowski et al. |
| 5,838,120 A | 11/1998 | Semenkin |
| 5,944,967 A | 8/1999 | Kunz et al. |
| 5,973,447 A | 10/1999 | Mahoney et al. |
| 6,365,010 B1 | 4/2002 | Hollars |
| 6,454,910 B1 | 9/2002 | Zhurin et al. |
| 6,608,431 B1 | 8/2003 | Kaufman |
| RE38,358 E | 12/2003 | Petrmichl |
| 6,699,374 B2 | 3/2004 | Marshall |
| 6,750,600 B2 | 6/2004 | Kaufman et al. |
| 6,812,648 B2 | 11/2004 | Luten et al. |
| 6,815,690 B2 | 11/2004 | Veerasamy et al. |
| 6,818,257 B2 | 11/2004 | Amann et al. |
| 6,870,164 B1 | 3/2005 | Baldwin et al. |
| 6,988,463 B2 | 1/2006 | Veerasamy et al. |
| 7,183,559 B2 | 2/2007 | Luten et al. |
| 7,241,360 B2 | 7/2007 | Shabalin et al. |
| 7,259,378 B2 | 8/2007 | Madocks |
| 7,411,352 B2 * | 8/2008 | Madocks .............. 315/111.21 |
| 7,932,678 B2 | 4/2011 | Madocks |
| 2002/0063054 A1* | 5/2002 | Marshall .............. 204/192.12 |
| 2003/0209198 A1* | 11/2003 | Shabalin et al. .......... 118/723 R |
| 2004/0075060 A1 | 4/2004 | Luten et al. |
| 2005/0247885 A1* | 11/2005 | Madocks .............. 250/423 R |
| 2006/0214580 A1 | 9/2006 | Bunker et al. |
| 2007/0166599 A1 | 7/2007 | Burtner et al. |
| 2008/0017112 A1* | 1/2008 | Murphy .............. 118/723 FI |
| 2010/0028238 A1 | 2/2010 | Maschwitz |

OTHER PUBLICATIONS

Journal of Vacuum Science & Technology A, "A quasidirectcurrent sputtering technique for the deposition of dielectrics at enhanced rates", by G. Este and W. D. Westwood; J. Vac. Sci. Technol. A, vol. 6, No. 3, May/Jun. 1988.

MF Sputtering-"A Powerful Process Tool for Large Area Coating", by T. Rettich and P. Wiedemuth, Huttinger Elektronik GmbH & Co. KG, Germany; ©1999 Society of Vacuum Coaters 505/856-7188, 42nd Annual Technical Conference Proceedings (1999) ISSN 0737-5921.

"Special Features of the Pulsed Magnetron Sputter Technology for Glass Coaters", by S. Schiller, V. Kirchoff, T. Kopte and M. Schulze, Fraunhofer-Institute fur Elektronenstrahl-und Plasmatechnik, Germany; © 1997 Society of Vacuum Coaters 505/856-7188, 40th Annual Technical Conference Proceedings (1997) ISSN 0737-5921.

* cited by examiner

CLOSED DRIFT MAGNETIC FIELD ION SOURCE APPARATUS CONTAINING SELF-CLEANING ANODE AND A PROCESS FOR SUBSTRATE MODIFICATION THEREWITH

CROSS-REFERENCE TO RELATED APPLICATIONS

This application claims priority of U.S. Provisional Patent Application Ser. No. 61/120,800 filed Dec. 8, 2008, which is incorporated herein by reference.

FIELD OF THE INVENTION

The present invention in general relates to a substrate surface modification, and in particular to a closed drift ion source with alternative charge bias applied to an electrically isolated anode to remove anode contaminating deposits.

BACKGROUND OF THE INVENTION

Ion sources have proven useful for the modification of substrates and for the deposition of thin films. The energetic ions serving to etch surfaces and provide energy to a growing film. A challenge confronting the industrial use of ion sources is the tendency for the anode to become contaminated by the process byproducts, particularly when those byproducts result in an insulating film forming on the anode. When the anode is coated by an insulating film, electrons can no longer effectively reach the anode and ion source operation is disrupted. The present invention relates to improvements in closed drift ion sources. Closed drift ion sources should not be confused with other types of ion sources that include gridded ion sources and ion sources with axial or mirror magnet field configurations. Gridded ion sources use a series of electrified grids to accelerate ions from a plasma discharge cavity. Multiple power supplies are required to operate a gridded ion source and ion source construction, with precision grids, makes these ion sources complex and expensive. Additionally, thermal expansion considerations of the grids makes extending these sources for use with large substrates impractical. Closed drift ion sources expose the ion accelerating anode to the process chamber and intervene an orthogonal magnetic field between the anode and the process chamber. Ion creating electrons are injected into the chamber and must cross the magnetic field lines to reach the anode. In encountering the magnetic field, the electrons drift in the Hall direction and by configuring the source to provide a closed racetrack, the electrons are effectively trapped in an endless loop. Side walls, floating or grounded and forming a channel between the process chamber and anode, block electron flow along magnetic field lines.

Closed drift ion sources have specific advantages that make them commercially successful: 1) By forcing electrons to cross magnetic field lines to reach the anode, a strong impedance to electron current is created that sets up an ion accelerating electric field of hundreds of volts. The resulting ion beam emanating from a closed drift ion source is energetically useful for a number of processes. This crossed magnetic field impedance is greater than the impedance across an axial or mirror magnetic field. 2) the Hall drift caused by orthogonal electric and magnetic fields tends to create a uniform electron current around the closed loop racetrack and a uniform ion beam emanates from the racetrack. This effect is very useful for treating large substrates as the racetrack can be extended over several meters.

The prior art has divided closed drift ion sources into three classifications: extended acceleration channel, anode layer types, and end Hall. Though not completely consistent, the general distinguishing factor between extended acceleration channel and anode layer types is the ratio of the electron confining channel width to the channel depth. If the channel depth exceeds the channel width dimension, the ion source is termed an extended acceleration channel type. Representative of an extended acceleration channel type of closed drift ion sources is U.S. Pat. No. 5,646,476. Prior art extended acceleration channel type sources have an anode that is positively charge biased.

Anode layer type ion sources are the second type of closed drift source. In an anode layer type source, the closed channel depth is typically shorter or equal to the width. Representative configurations of the anode layer type of closed drift ion sources are U.S. Pat. Nos. 5,763,989; 5,838,120 and 7,241,360. U.S. Pat. No. 7,241,360 is characterized by having the entire ion source biased charge negative on the negative AC cycle to sputter clean the ion source.

End Hall ion sources represent a variation of a closed drift ion source. In the end Hall source, the inner magnet pole is lower with respect to the outer pole to expose the sides of the annular anode. With this geometry, a second electron confinement regime combines with the Penning style confinement of closed drift ion sources. The second confinement regime is mirror electron confinement in which electrons are partially confined along magnetic field lines by a gradient magnetic field. Representative of such sources are U.S. Pat. Nos. 6,750,600 and 6,870,164. In particular, U.S. Pat. No. 6,750,600 attempts to reduce the loss of anode conductivity associated with contaminant deposition on the anode. U.S. Pat. No. 6,870,164 addresses anode degradation through contaminant deposition thereon by applying a positive charge bias in pulses to the anode to avoid operational instabilities, yet does not bias the anode negative such that a plasma is generated on the anode.

Numerous approaches have been taken to address the problem of anode contamination for all types of closed drift ion sources. In spite of this, there remains a need for a process and apparatus for closed drift ion source that can consistently operate without losing anode conductivity over time. Ideally, a solution would include a self-cleaning anode that remained free from insulating buildups even over extended process times of many 10's of hours.

SUMMARY OF THE INVENTION

A process for modifying a surface of a substrate is provided that includes supplying electrons to an electrically isolated anode electrode of a closed drift ion source. The anode electrode has an anode electrode charge bias that is positive while other components of the closed drift ion source are electrically grounded or support an electrical float voltage. The electrons encounter a closed drift magnetic field that induces ion formation from gas present in a vacuum chamber encompassing the first anode electrode. The ions are then accelerated as a beam to impinge on the surface of the substrate and modify the surface. Surface modification includes etching, assisting a magnetron sputter deposition process, ion enhanced thermal deposition, and plasma enhanced chemical vapor deposition. Anode contamination is prevented by switching the electrode charge bias to negative in the presence of a gas, a plasma is generated proximal to the anode electrode to clean deposited contaminants from the anode electrode. The electrode charge bias is then returned to positive in the presence of a repeat electron source to induce repeat ion formation to again modify the surface of the substrate.

An apparatus for modification of a surface of a substrate is provided that includes a closed drift ion source having an electrically isolated anode electrode, and other components including ferromagnetic poles, and magnets that form a closed drift magnetic field. The other components are electrically grounded or support an electrical float voltage. A power supply selectively powers the anode electrode with a charge bias with a positive charge bias duration and a negative charge bias duration. An electron emitter supplies electrons to the anode electrode when the electrode charge bias is positive.

DETAILED DESCRIPTION OF THE PREFERRED EMBODIMENTS

Figure 1A:
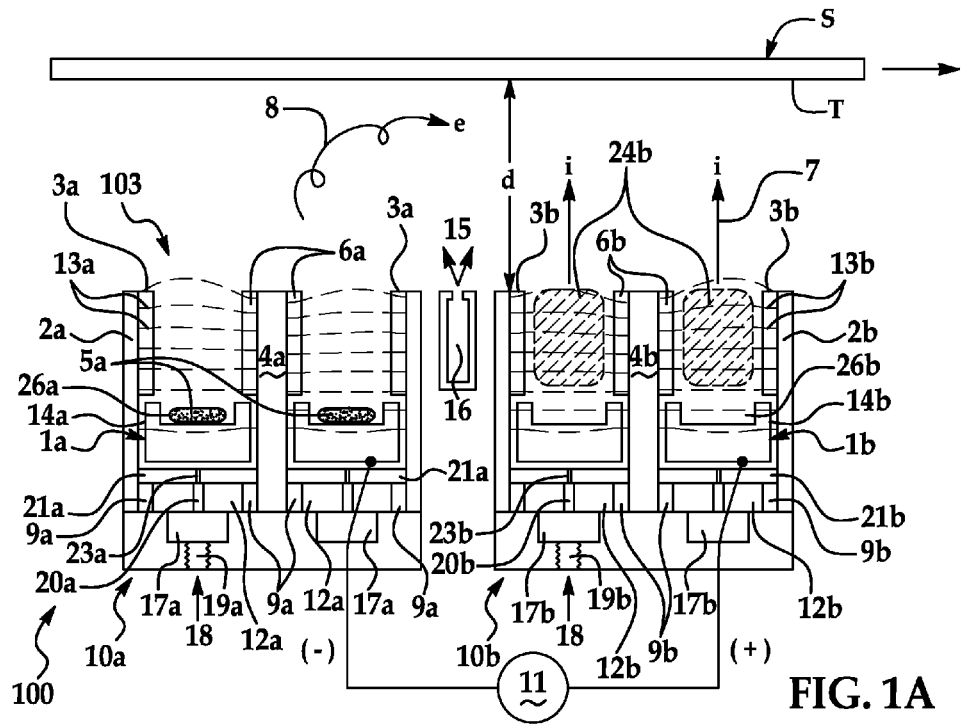
FIG. 1A is a cross-sectional view of an inventive apparatus with an alternating current power supply depicting an instance in which the left closed drift sputter ion source is negatively biased and the right closed drift sputter ion source is positively biased.

The present invention has utility as an apparatus for the surface modification of a substrate including etching or deposition and, in particular, for deposition of insulating films on the substrate. The electrode of a closed drift sputter ion source is synonymously termed herein as an anode or an anode electrode. Stable and reproducible modification of substrate surfaces for extended operational periods are achieved by the present invention through the application of a negative charge bias onto an electrically isolated anode of a closed drift ion source at intervals and for a duration sufficient to suppress ion formation from the anode and instead support a sputtering plasma that cleans deposited contaminants from the anode. As a result of maintaining the anode in a clean state, reproducible surface modification properties and longer operational spans between maintenance for the resultant apparatus are achieved.

The present invention is premised on the recognition that in contrast to the prior art, applying a negative bias to both the poles and anode electrodes of a closed drift ion source results in sputter deposition of cathode pole material as a contaminant onto a surface of the substrate. By applying a negative charge bias only to the anode, the anode material is readily selected so as not to afford contamination to the surface of a given substrate. Providing such material constraints to the housing, cathode and other components of a closed drift ion source would preclude substrate surface contamination and greatly complicate manufacture and operation of such a hypothetical device. Additionally, applying a negative bias to an anode of a closed drift ion source alone achieves sputtering cleaning of the anode and eliminates considerable effort associated with electrically isolating other components of the closed drift ion source such as gas and water lines, pole covers, shields, and the like.

The closed drift impedance path blocking electron flow to the electrode in an inventive apparatus should not be confused with mirror impedance. The closed drift impedance of the present invention is greater than mirror impedance. For instance, the voltage developed across a closed drift region is approximately 300 volts, while the voltage developed across a magnetic mirror is closer to 80V. This is an important and fundamental difference between these two electron confinement methods. In the case of the present invention, a closed drift confinement is produced that results in the higher impedance and higher ion energy. This higher ion energy is particularly useful for certain film deposition and etch processes. For instance, the growth of diamond like coatings (DLC) is enhanced by the higher energy of a closed drift type ion source. Other film formation processes that benefit from higher ion energy are oxygen and water permeation barrier films.

By coupling two closed drift ion sources energized by an alternating current power supply, when an anode of a first source is negatively charge biased, the source operates as a sputter magnetron supplying electrons by way of a closed drift magnetic field to the other source having a positively charged bias anode such that the second source creates ions that impinge on the surface of a substrate to effect a modification of the surface. By alternating the charge bias on the electrically isolated anodes alone of the coupled sources, both anodes remain clean and a steady state substrate surface modification environment is achieved.

Figure 1B:
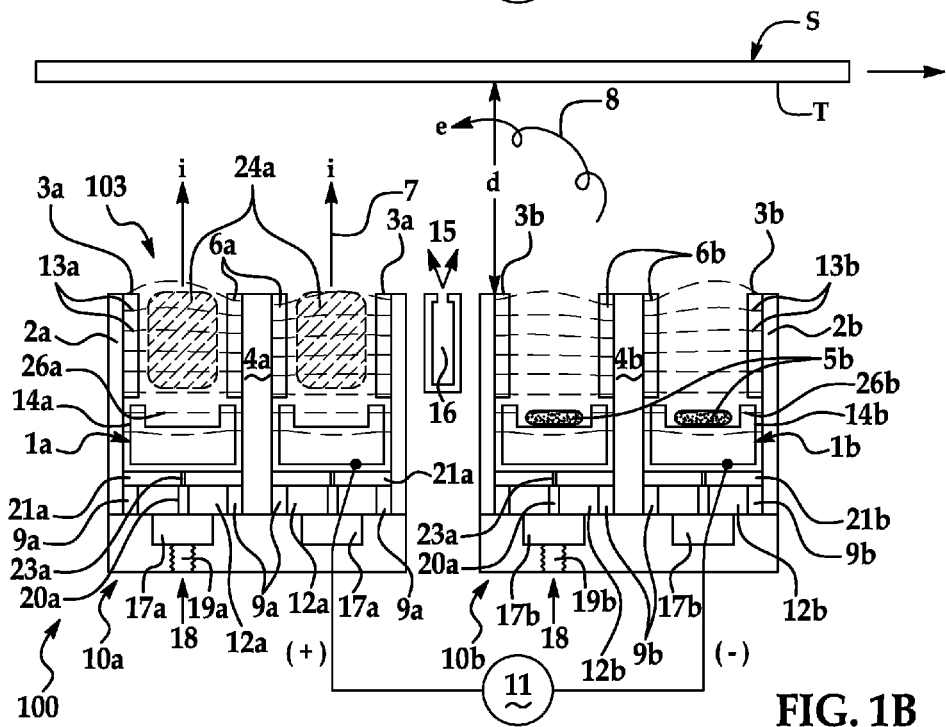
FIG. 1B is a cross-sectional view of an inventive apparatus of FIG. 1A at another instance at which the left closed drift sputter ion source is positively biased and the right closed drift sputter ion source is negatively biased.
Figure 2:
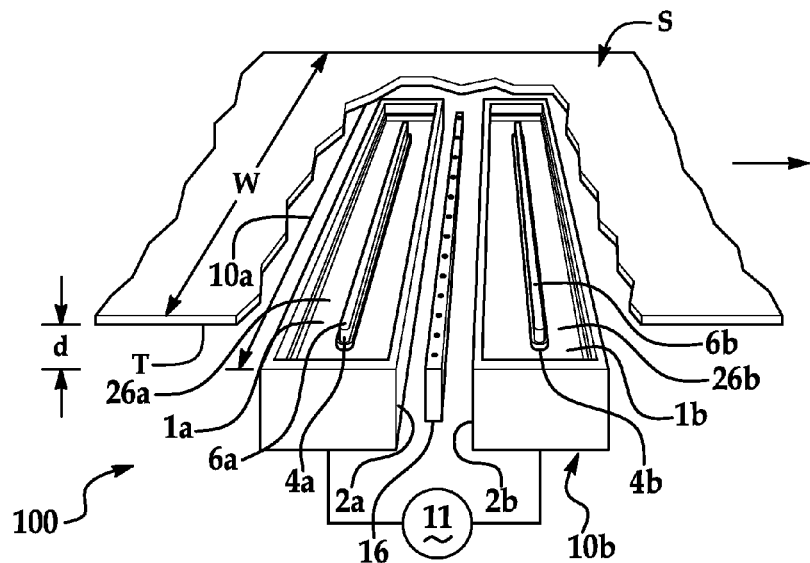
FIG. 2 is a perspective view of the inventive apparatus depicted in FIG. 1A.

Referring now to FIGS. 1A, 1B and 2, the inventive apparatus is depicted generally at 100 with two closed drift ion sources 10a and 10 b connected to a power supply 11. As noted throughout FIGS. 1A, 1B and 2, like attributes of ion sources 10 a and 10 b associated with each respectively are noted with the given reference numeral followed by the letter a for the attribute associated with ion source 10 a and the corresponding reference numeral followed by the letter b for an attribute associated with ion source 10 b. The anode electrodes 1 a and 1 b are fashioned as rectilinear annuluses, as best seen in FIG. 2 with the length 102 of a source 10 a preferably being within ±10% of the width W of a substrate S. It is appreciated that the length102 can extend to several meters to accommodate a substrate S. Still more preferably, the length 102 of a source 10a is longer than the width W to limit substrate modification profiles of the edges defining the width W associated with magnetic field edge effects associated with the sources 10a and 10b. It is appreciated that each source 10a and 10b, is independently configured with other shapes depending on the nature of the substrate with other shapes illustratively including ellipsoidal or circular annuluses, or ellipsoidal or circular plates, or nested forms of the two sources. Concentric annular sources are exemplary of a nested configuration of two such sources. It is appreciated that considerable efficiencies in both manufacture and operation are achieved in instances when both sources 10a and 10b have interchangeable components therebetween. Each source 10a and 10b has an anode electrode, 1a and 1b, respectively. The electrodes 1a and 1b are both connected to the power supply, shown schematically at 11. The nature of the power supply 11 is limited only by the capability of the apparatus to occasionally switch bias on the anode to negative for a sufficient duration to induce anode sputter self-cleaning. The power supply 11 includes any number of commercially available power supplies, such as alternating current (AC), radio frequency (RF), pulsed direct current (pulsed DC), and other pulsed waveform sources. An AC power supply is preferred thr most surface modification processes due to their low cost and ready availability in high power versions in the 10's of kilowatts. Typical alternating current frequencies for an AC power supply 11 range from 1 kiloHertz to 1 megaHertz and preferably range from 10 to 100 kiloHertz. The electrodes 1a and 1b as depicted are annular in shape, thereby forming a closed racetrack shape that is conventional to closed drift ion sources. Each of the electrodes 1a and 1b is electrically isolated by standoffs (not shown) that isolate the electrodes 1a and 1b from other components of the sources 10a and 10b. To support prolonged operation of an inventive apparatus 100, the electrodes 1a and 1b are preferably cooled by water circulating in a closed loop in thermal communication with the electrodes 1a and 1b. Water cooling channels are not depicted for visual clarity.

Plasma discharge regions 24a and 24b are confined geometrically by electrodes 1a and 1b, and outer pole covers 3a and 3b and inner pole inner covers 6a and 6b, respectively, with the plasma regions 24a and 24b extending towards a surface T of the substrate S. The interaction of magnets collectively shown at 9a, back shunt 12a, and ferromagnetic poles 2a and 4a together define a magnetic field 13a in the plasma region 24a. A corresponding magnetic field 13b is formed in the plasma region 24b defined by corresponding components 9b, 12b, poles 2b, and 4b. Optionally, each source 10a or 10b is independently provided with a heat shield 21a or 21b, respectively. The shield (21a or 21b) reduces thermal radiation emanating from electrodes (1a or 1b), and impinging upon magnets (9a or 9b), respectively. Materials particularly well suited for heat shielding include virtually any material that is not ferromagnetic, with aluminum constituting a preferred material from which to form a heat shield. Optionally, the sides of the inner ferromagnetic poles 4a and 4b are fitted with covers 6a and 6b, respectively. Similarly, the sides of the outer ferromagnetic poles 2a and 2b are optionally fitted with cover 3a and 3b, respectively. The material from which covers 3a, 3b, 6a and 6b, if present, are selected to protect the respective poles from the environment created by the inventive apparatus 100 during operation and are chosen to be compatible with a particular substrate surface modification chemistry.

The sputter effect of the electrode is controlled by the selection of electrode materials. For instance, the electrode material may be selected to have a low sputter rate and a high secondary electron emission rate. Aluminum is an exemplary material when oxygen source gas is used. In this case, the electrode surface is oxidized and alumina is formed. Alumina has a slow sputter rate and has a high secondary electron emission yield. The electrode material may also be selected to minimize any deleterious effect on the substrate and process. For instance, all iron containing materials would be avoided when depositing electronic grade silicon films. In this case, the electrode is preferably coated with a silicon film. In addition to the electrode material, the pole cover material should also be considered. The pole covers also are eroded by the high energy plasma. These materials are selected based on similar considerations as the electrode.

A source gas is provided to an inventive apparatus 100 in a variety of locations. As shown in FIGS. 1A, 1B and 2, source gas 18 is shown entering closed drift ion source 10b through hole 19b that is in fluid communication with gas manifold 17b. Manifold 17b is preferably a continuous annular groove with the two portions 17b depicted in FIGS. 1A and 1B being in fluid communication. Manifold 17b is in fluid communication with the corresponding manifold 17a of source 10a or alternatively, manifold 17a is supplied with a separate source gas that varies in composition, flow rate, or a combination thereof. For manifold 17b, source gas 18 flows through apertures 20b through the back shunt 12b, and into a dark space 14 between anode electrode 1b and the surrounding structures via a path created by gas exit hole 23 in heat dissipator plate 21b. A similar gas path exists for manifold 17a as denoted by common reference numerals having a suffix of "a". From dark region 14, molecules of the source gas 18 in source 10b flow into plasma region 24b. Optionally, an external gas 15 is supplied by a manifold 16. While the manifold 16 is depicted as intermediate between ion sources 10a and 10b, it is appreciated that external gas 15 is readily reacted through admission into a vacuum chamber proximal to an inventive apparatus and other locations illustratively including proximal to surface T of the substrate S, for example at the left side of FIGS. 1A, 1B, and 2.

An inventive apparatus 100 is installed in a vacuum chamber with substrate S. To activate an apparatus 100, source gas 18 is delivered into hole 19 and into proximity with electrodes 1a and 1b. Power supply 11 is then activated, applying a charge bias to the first anode electrode 1a and the second anode electrode 1b. The power supply 11 is preferably an alternating current power supply. By way of example, the surface T of the substrate S is moved laterally across apparatus face 103 that is generating plasma and induced electrons 8 and an ion beam 7 to provide a desired uniformity of surface modification of surface T. Surface modifications that are readily performed by an inventive apparatus 100 include etching of surface T, deposition of islands of material, or deposition of a film of material. It is appreciated that the separation distance, d between the emitting face 103 of an inventive apparatus 100 and a surface T of substrate S can vary depending on the particulars of the process. By way of example, in line plasma enhanced chemical vapor deposition (PECVD) and a large area substrate, the separation distance d is typically between 25 and 100 millimeters.

In operation, the source gas 18 is delivered to an inventive apparatus 100 such that a local plasma region 24a or 24b has a source gas pressure sufficient to ignite magnetron sputter plasma 5a or 5b on electrodes 1a or 1b, respectively. Typical pressures for the source gas 18 are from 1 to 50 milliTorr. The source gas 18 illustratively includes noncondensing gases such as oxygen, helium, argon, nitrogen, or combinations thereof, with oxygen constituting a reactive source gas, while the other gases listed are inert under operating conditions with the proviso that nitrogen under certain conditions forms nitrides. When first anode electrode 1a has a negative charge bias, magnetron sputter plasma 5a ignites in proximity to electrode 1a thereto. Preferably, anode electrodes 1a and 1b have facial recesses 26a and 26b, respectively, that serves to define spatial extent of sputter plasma. As shown in FIG. 1A in which anode electrode 1a has a charge bias that is negative, plasma 5a ignites and supplies electrons (e−) 8 to ion source 10b that has second anode electrode 1b with a charge bias opposite that of the first anode electrode, namely anode electrode 1b has a positive charge bias. As electrons 8 must reach the positively biased anode electrode 1b to complete a power supply current loop, the electrons 8a must pass through a closed drift magnetic field in the plasma region 24b, and as shown in FIG. 1A, ion source 10b alone is functioning as a typical closed drift ion source conventional to the art. An inventive apparatus 100 results by the combination of alternating charge bias between positive and negative on a given anode electrode such that for at least some portion of time a magnetron sputter plasma is supported in the electrode 1a or 1b, while other ion source components including ferromagnetic poles 2a, 2b, 4a and 4b and pole covers 3a, 3b, 6a and 6b are excluded from the electrical power supply-anode electrical circuit. These other components of a closed drift ion source are either present electrically grounded or support an electrical float voltage. Preferably, these other components are electrically floating. As shown in FIG. 1A, the electrons 8 induce ion formation from ion source 10b. These ions are accelerated towards the surface T as ion beam 7. One of skill in the art will readily appreciate that ion beam (i) 7 can be used to etch surface T and react with surface T alone or in combination with a precursor gas to create deposition thereon.

When the voltage depicted in FIG. 1A reverses, electrodes 1a and 1b reverse charge bias and function with ion source 10b providing ionizing and neutralizing electrons to ion source 10a now operating as an ion source and generating ion beam 7, as depicted in FIG. 1B.

As the ion sources 10a and 10b alternate anode electrode charge bias, each ion source alternates between being an electron source and an ion source, and as a result a dense plasma and ion beam alternately emit from each of the ion sources 10a and 10b. It is appreciated that the rms velocity of ions of an inventive apparatus is much slower than that of electrons, and as such inventive apparatus 100 with charge bias switching at the appropriate frequencies effectively functions as a summation of the scenarios depicted in FIGS. 1A and 1B in what is effectively steady-state surface modification ion beam production. In the process of the steady state operation, each anode electrode 1a and 1b is continually self-cleaning during function as an electron source. With continual self-cleaning of anode electrodes, apparatus operational control stability is greatly improved.

The inventive apparatus 100 is appreciated to be particularly useful for PECVD processes with the introduction of precursor gas 15 through external manifold 16. It is appreciated that positioning of the manifold 16 intermediate between the dense plasma and ion source regions between the ion sources 10a, 10b, and the surface T of the substrate S is preferred. It is noted that delivery of a reactive precursor gas 15 outside plasma regions 24a and 24b reduces contaminant buildup associated with decomposition of precursor gas molecules within the sources 10a and 10b. The ability of an inventive apparatus 100 to self-clean anode electrodes 1a and 1b during operation greatly facilitates PECVD and especially when molecules of precursor gas 15 encounter energized ions and electrons that activate the reactant molecules in the distance gap between the face of the apparatus 100 and the surface T to create reactive intermediates in this distance gap d. Upon the reactive intermediates encountering the surface T, these activated intermediates of precursor gas 15 condense on the surface T. It is noted that the energetics of an ion beam 7 of an inventive apparatus 100 promote dense high quality PECVD films, as compared to those produced absent ion beam impact during CVD deposition. It is appreciated that the long acceleration channel type source of FIGS. 1A and 1B, serves to retard egress of reactive condensing gas into the source 10a or 10b.

As a result of an inventive apparatus providing electrically isolated anode self cleaning, an inventive apparatus readily operates under vacuum in the presence of oxygen as a reactive source gas without the need of argon or other inert cover gases. It is appreciated that AC with an operating frequency of between 10 and 100 kiloHertz asynchronously power tandem ions sources represents a particularly preferred embodiment to preclude insulating contamination buildup on the anode. The kilohertz AC is of sufficiently high frequency to allow current to capacitively couple though any thin oxide that builds up on the anode during either the positive charge bias cycle (electrons reaching the anode) or the negative charge bias cycle (ions hitting the anode). This is in contrast to conventional ion sources operating with direct current power supplies. Additionally, in the tandem configuration, the electrode target materials can be chosen to be compatible with a pure oxygen environment. For instance, aluminum targets can be used. In operation, the aluminum target surface oxidizes and becomes alumina. In the cathode, electron generating, operation mode, the alumina surface sputters slowly and has a high secondary electron emission. These are ideal attributes for the sputter ion source electrode. The ability to operate in a pure reactive gas differs from conventional ion sources that require argon to be delivered through the source to avoid poisoning the anode surface or prematurely wearing out hollow cathode or filament electron source. The elimination of the requirement to flow argon, or other inert cover gases, reduces the gas load on the pumping system to allow for the use of lower throughput pumps and simplified overall operation.

FIG. 2 shows a perspective view of the apparatus 100 of FIGS. 1A and 1B. This view shows the ability of the present invention to be applied to large area substrates like glass sheets or rolls of plastic film. It is appreciated that an inventive apparatus ion source is also readily formed with a round or other dimensioned annular electrode layout. The extension of closed drift ion sources to different lengths is well known in the art. The important criterion is the creation of the closed drift electron Hall current path around the racetrack.

Figure 3:
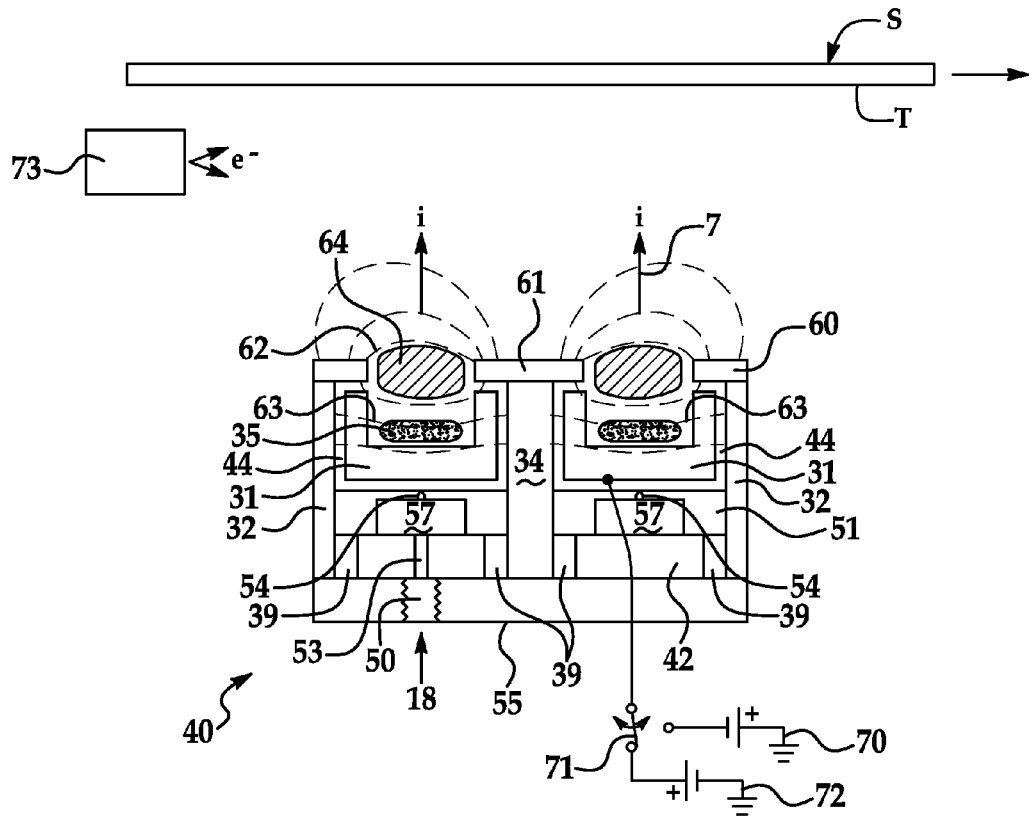
FIG. 3 is a cross-sectional view of an inventive apparatus configured with a short acceleration channel and a power source switching schematic.

A closed drift ion source containing a self-cleaning anode is shown generally at 40 in FIG. 3 with an acceleration channel formed between outer ferromagnetic pole 32 and inner ferromagnetic pole 34 being short compared to that depicted with respect to FIGS. 1A and 1B. Like numerals used in FIG. 3 have the meanings previously ascribed to those numerals. Source 40 has like material components relative to those detailed with respect to the ion sources 10a and 10b. The source 40 with a short acceleration channel is an anode layer type ion source. The inner pole 34 is covered by a pole cap 61, and the outer pole 32 is covered by corresponding pole cap 60. The caps 60 and 61 are optionally provided to focus additional magnetic field strength 62 over electrode 31. Magnets 39 and back shunt 42 generate the closed drift magnetic fields including field lines 63 and 62. Electrode 31 is supported away from the surrounding electrically floating surfaces by an insulator standoff (not shown). Source gas 18 is delivered into the sputter region 35 and plasma region 64 through a tapped hole 50 in back cover 55, a gas exit hole 53 in back shunt 42, a gas manifold region 57, and distribution holes 54 into a dark region 44. The electrode 31 and other components are optionally water cooled as needed using well known methods.

The source 40 is a single source with anode electrode 31 connected to two power supplies. Switch 71 allows either power supply 70 or 71 to be connected to electrode 31. With power supply 70 connected, electrode 31 is biased negative and a plasma discharge 35 is sustained on electrode 31. The discharge 35 serves to clean contaminating buildups from electrode 31. When switch 71 is set to connect electrode 31 to power supply 72, electrode 31 is biased positively and source 40 operates as a conventional closed drift ion source producing ion beam 7. In this ion source mode, a source of electrons 8 is typically required to neutralize the emitted ions and to provide electron current to electrode 31. Electron emitter 73 is provided for this purpose and illustratively includes a filament, hollow cathode, or sputter magnetron, such as a negatively biased source 10A or other conventional magnetron cathode. It is appreciated that after ignition source 40 can optionally operate without an electron emitter 73, through resort to secondary electron emission from the ion beam impinging on substrate S and pole covers 60 and 61 that can supply sufficient electrons for ion source operation.

Typically, electrode 31 is connected to power supply 72 for extended time durations and source 40 would operate as an ion source. When the source voltage increases to a preselected value indicating contamination of anode electrode 31, power supply 70 is switched on and electrode 31 is sputter cleaned. Once the brief cleaning cycle is completed, operation is returned to the ion source mode to modify a proximal surface T.

Figure 4:
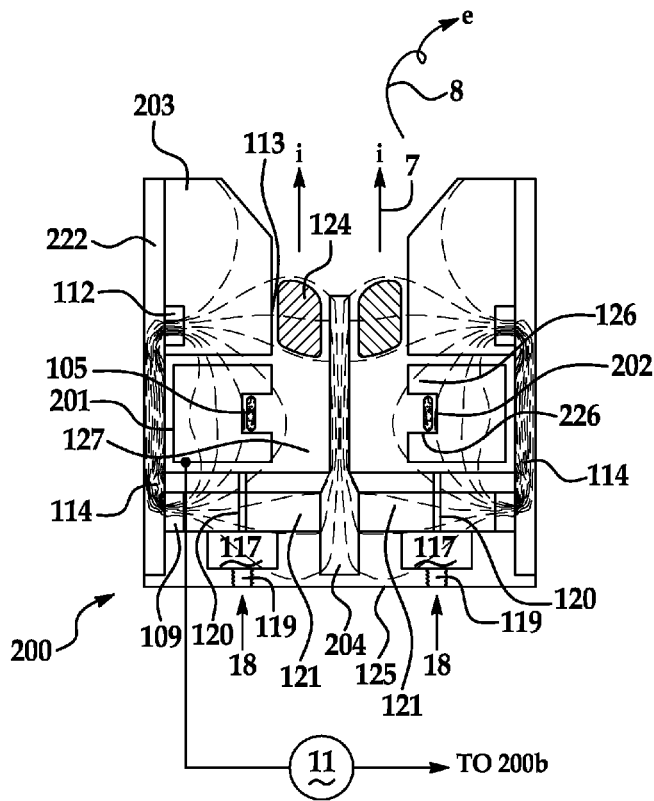
FIG. 4 is a cross-sectional view of an inventive apparatus that supports plasma discharge on inner sides of the anode during negative anode bias, a second closed drift source like that shown and a substrate proximal to the apparatus are omitted for visual clarity.

FIG. 4 depicts an ion source 200 with an anode electrode 201 supporting a sputter discharge 105 on an inward facing surface 202 thereof. Like numerals used in FIG. 4 have the meanings previously ascribed to those numerals. Magnets 109 and 112 create a closed racetrack magnetic confinement 126 over electrode 201 to create the confining field. The electrode 201 optionally has a recess 226 to enhance the confinement 126. The electrode 201 is electrically isolated with a standoff not shown in FIG. 4 for visual clarity. The recess 226 defines the sputter discharge 105 and also serves to further hide the conductive electrode region from potential insulating coating building during operation, especially in the contaminating environments associated with a PECVD process. Source 200 optionally has side shunts 222, and/or center shunt 204. A base 125 supports the remainder of the source 200. Magnets 112 serve to form both the magnetron confinement field 126 and the closed drift confinement field lines 113. Closed drift confinement field lines 113 cross through the open discharge area between a magnet cover 203 and center shunt 204. Source gas 18 is delivered into source 200 via a tapped hole 119 in communication with manifolds 117 and apertures 120. Apertures 120 are drilled in a nonferromagnetic heat shield cover 121. The cover 121 keeps magnets 109 isolated from the potential heat of electrode 201 and also holds center shunt 204 in place. Source gas 18 flows into the dark space region 114 between electrode 201 and the electrically isolated surrounding components. Insertion of source gas 18 into the dark space 114 assures most of the gas 18 flows into the region adjacent to sputter plasma 105 at 127. A second source 200b, identical to source 200, is connected across power supply 11.

In operation, source 200 alternates as a sputter magnetron, supplying neutralizing electrons 8 to source 200b and as a closed drift ion source depending on anode charge bias. During the positive anode bias, such as during part of an AC cycle, electrons 8 attempting to reach electrode 201 are impeded by magnetic field lines 113 and gas atoms are ionized in region 124 to generate ion beam 7. During the negative bias for the anode, the plasma discharge 105 is sustained on electrode 201 that serves to supply neutralizing and ion generating electrons 8 to the second source 200b and also cleans electrode 201 of contaminating buildups.

Figure 5:
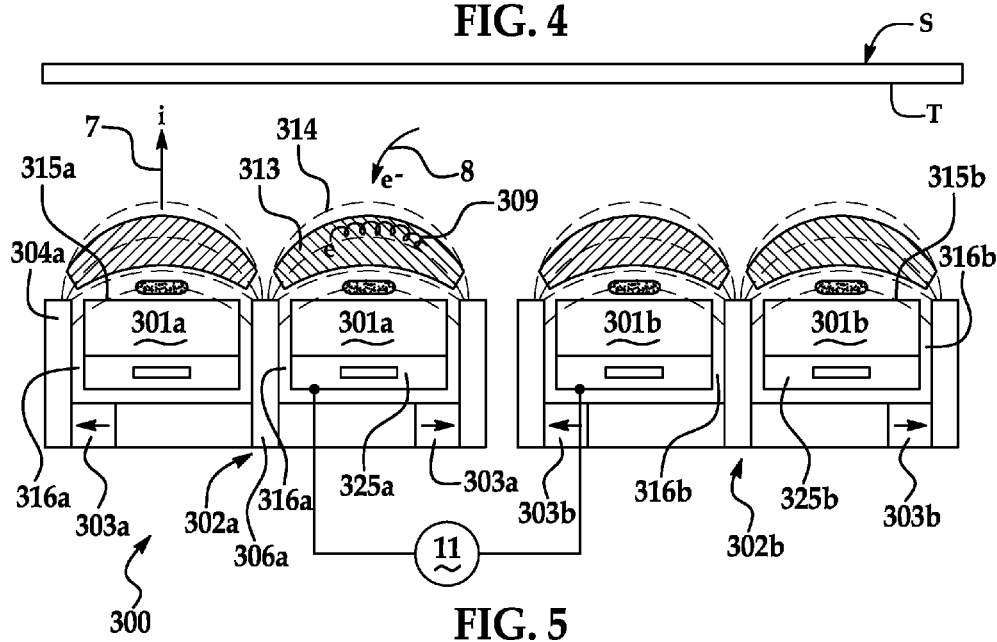
FIG. 5 is a cross-sectional view of an inventive apparatus particularly well suited for sputter deposition and showing electrodes fully exposed to a surrounding vacuum chamber and substrate.

FIG. 5 depicts another self-cleaning anode ion source apparatus at 300 that contains a first ion source 302a and a second closed drift ion source 302b. Like numerals used in FIG. 5 have the meanings previously ascribed to those numerals. In this case, the electrodes 301a and 301b are fully exposed to the vacuum chamber and substrate S. The source 302a is paired with a second source 302 across power supply 11. While source 302b is identical to source 302a, it is appreciated that other sources are operative in place of source 302b. These include conventional magnetrons and sources 10b, 40 and 200. Magnets 303a and 303b in sources 302a and 302b, respectively, form sputter confinement field lines 315a and 315b and closed drift confinement field lines 314a and 314b in sources 302a and 302b. Magnetic circuits are further defined by back shunt 305a, outer shunt 304a and inner shunt 306a and in source 302 by back shunt 305b, outer shunt 304b and inner shunt 306b. The electrode 301a is optionally a rectangular annulus or a round annulus, and ellipsoidal. Electrodes 301a and 301b are optionally water cooled. Cooling water, if present, flows through conduits 311a and 311b in backing plates 325a and 325b. Water cooling supply and return tubes are not shown for visual clarity. The backing covers 325a and 325b, as well as electrodes 301a and 301b, are supported from other source components by insulator standoffs 1011 (not shown). Dark space regions 316a and 316b are maintained to allow electrodes 301a and 301b to be at high voltage with the surrounding other source components remaining at ground or at floating voltage. Preferably, the surrounding other source components are supported at floating voltage.

In operation, with an AC power supply 11 turned on, source 302a alternates between operation as a sputtering magnetron and a closed drift ion source. When the source 302a is biased positive in relation to the source 302b across power supply 11, the ion source mode is in effect on source 302a. In this mode, electrons 8 trying to reach target surface of electrode 301a are impeded by magnetic field lines 314. As electrons 8 gyrate at 309 around field lines 314, the electrons 8 collide with atoms and create ions in crosshatched region 313. These ions then experience an accelerating electric field from electrode 301a and the ions are propelled as an ion beam 7 toward surface T of substrate S. Region 313 is created by magnetic field lines 314 passing from floating or grounded surfaces of the outer poles 304a and inner pole 306a, respectively. Field lines 314 bounded by the pole surfaces create the closed drift impedance region of the inventive method.

Apparatus 300 exemplifies a significant aspect of the present invention: unlike a dual sputter magnetron, an inventive apparatus presents a true closed drift impedance to incoming electrons 8. As is known in dual magnetron sputtering, when one magnetron is biased positively, it acts as the anode for the other magnetron. In this case, electrons flow from the negative cathode magnetron to the positive magnetron to complete the electrical circuit. In prior art dual magnetrons, electrons can reach the positive magnetron without crossing magnetic field lines. In prior art dual magnetrons, the center of the electrode is conductive to electron flow. In this region electron flow may be impeded by a magnetic mirror but not the higher impedance crossed field lines. The present invention realizes that a sputter magnetron and closed drift ion source can be combined to produce an improved operation ion and sputter source. The apparatus coats a surface T of substrates with a sputtered film from electrode 301 while also being bombarded by a high energy ion beam 7. This dual effect is appreciated to be ideal for making high density, high quality film deposits on surface T.

Patent documents and publications mentioned in the specification are indicative of the levels of those skilled in the art to which the invention pertains. These documents and publications are incorporated herein by reference to the same extent as if each individual document or publication was specifically and individually incorporated herein by reference.

The foregoing description is illustrative of particular embodiments of the invention, but is not meant to be a limitation upon the practice thereof. The following claims, including all equivalents thereof, are intended to define the scope of the invention.

The invention claimed is:

1. A process for modifying a surface of a substrate comprising:
   biasing a first electrode positive inside a process chamber and with intervening magnetic field lines between said first electrode and said process chamber, said magnetic field lines forming a first closed drift confinement region;
   supplying electrons wherein said electrons must cross said first closed drift confinement region to reach said first electrode, said electrons inducing ion formation in said closed drift region from a gas present in said process chamber;
   impinging on the surface of the substrate with said ions to modify the surface;
   switching said first electrode charge bias to negative in the presence of said gas to suppress ion formation and generate a first magnetron sputter plasma proximal to said first electrode, said first magnetron sputter plasma created by magnets forming a magnetron sputter confinement field on said first electrode;
   cleaning deposited contaminants from said first electrode with said magnetron sputter plasma; and
   returning said first electrode charge bias to positive to induce repeat ion formation modifying the surface of the substrate.

2. The process of claim 1 wherein said electrons are supplied by an electron emitter.

3. The process of claim 2 wherein said electron emitter is a second electrode having a charge bias that is opposite said first electrode charge bias during the ion formation and said repeat ion formation, said second electrode supporting a second electrode magnetron sputter plasma when said first electrode charge bias is positive.

4. The process of claim 3 wherein said second electrode has a second closed drift confinement region formed by magnetic field lines intervening between said second electrode and said process chamber.

5. The process of claim 4 wherein a single alternating current power supply simultaneously supplies the first electrode charge bias and the second electrode charge bias opposite the first electrode charge bias at an alternating current frequency.

6. The process of claim 5 wherein the alternating current frequency is between 10 and 100 kiloHertz.

7. The process of claim 1 wherein said first electrode is electrically isolated from other source components.

8. The process of claim 7 wherein said other source components include ferromagnetic poles and pole covers.

9. The process of claim 1 wherein the modifying of the surface of the substrate is deposition of an electrically insulating film.

10. The process of claim 1 wherein the modifying of the surface of the substrate is deposition of a film and further comprising laterally moving said substrate during the deposition.

11. The process of claim 1 further comprising introducing a plurality of precursor gas molecules into contact with said first electrode plasma and said ions to decompose said plurality of precursor gas molecules to form a coating substance deposited on the surface of the substrate.

12. The process of claim 11 wherein said plurality of precursor gas molecules is introduced external to the closed drift confinement region.

13. The process of claim 4 wherein electrons are supplied to said second electrode when said second electrode has a positive bias wherein said electrons must cross said second closed drift confinement region to reach said second electrode, said electrons inducing ion formation in said second closed drift region from said gas present in said process chamber,
   said ions formed in said second closed drift region impinging on the surface of said substrate to modify the surface.

14. The process of claim 3 wherein a single alternating current power supply simultaneously supplies the first electrode charge bias and the second electrode charge bias opposite the first electrode charge bias at an alternating current frequency.

15. The process of claim 13 wherein a single alternating current power supply simultaneously supplies the first electrode charge bias and the second electrode charge bias opposite the first electrode charge bias at an alternating current frequency.

* * * * *

UNITED STATES PATENT AND TRADEMARK OFFICE
CERTIFICATE OF CORRECTION

| | |
|---|---|
| PATENT NO. | : 9,136,086 B2 |
| APPLICATION NO. | : 13/132762 |
| DATED | : September 15, 2015 |
| INVENTOR(S) | : John E. Madocks et al. |

It is certified that error appears in the above-identified patent and that said Letters Patent is hereby corrected as shown below:

In the specification,

In column 4, line 39, delete "10 b" and insert -- 10b --, therefor.

In column 4, line 41, delete "10 a and 10 b" and insert -- 10a and 10b --, therefor.

In column 4, line 43, delete "10 a" and insert -- 10a --, therefor.

In column 4, line 45, delete "10 b" and insert -- 10b --, therefor.

In column 4, line 46, delete "1 a and 1 b" and insert -- 1a and 1b --, therefor.

In column 4, line 47, delete "10 a" and insert -- 10a --, therefor.

In column 5, line 7, delete "thr" and insert -- for --, therefor.

In column 5, line 12, delete "1 b" and insert -- 1b --, therefor.

In column 10, line 15, after "standoffs" delete "1011".

Signed and Sealed this
Twenty-second Day of March, 2016

Michelle K. Lee
*Director of the United States Patent and Trademark Office*